United States Patent
Kurii et al.

(10) Patent No.: US 9,011,712 B2
(45) Date of Patent: Apr. 21, 2015

(54) MICROETCHING SOLUTION FOR COPPER, REPLENISHMENT SOLUTION THEREFOR AND METHOD FOR PRODUCTION OF WIRING BOARD

(71) Applicant: Mec Company Ltd., Hyogo (JP)

(72) Inventors: Masayo Kurii, Hyogo (JP); Kiyoto Tai, Hyogo (JP); Mami Nakamura, Hyogo (JP); Yuki Ogino, Hyogo (JP)

(73) Assignee: Mec Company Ltd., Hyogo (JP)

( * ) Notice: Subject to any disclaimer, the term of this patent is extended or adjusted under 35 U.S.C. 154(b) by 0 days.

(21) Appl. No.: 14/360,783

(22) PCT Filed: Jun. 25, 2013

(86) PCT No.: PCT/JP2013/067365
§ 371 (c)(1),
(2) Date: May 27, 2014

(87) PCT Pub. No.: WO2013/187537
PCT Pub. Date: Dec. 19, 2013

(65) Prior Publication Data
US 2014/0326696 A1    Nov. 6, 2014

(30) Foreign Application Priority Data
Sep. 28, 2012   (JP) .................. 2012-216235

(51) Int. Cl.
C09K 13/00 (2006.01)
C23F 1/18 (2006.01)
H05K 3/38 (2006.01)
H05K 3/06 (2006.01)

(52) U.S. Cl.
CPC *C23F 1/18* (2013.01); *H05K 3/383* (2013.01); *H05K 2203/0789* (2013.01); *H05K 3/067* (2013.01); *H05K 2203/0307* (2013.01)

(58) Field of Classification Search
CPC .......... C23F 1/18; H05K 3/383; H05K 3/067
USPC ................... 252/79.1, 79.4; 216/106
See application file for complete search history.

(56) References Cited

U.S. PATENT DOCUMENTS

| 5,807,493 A | 9/1998 | Maki et al. |
| 5,965,036 A | 10/1999 | Maki et al. |
| 6,426,020 B1 | 7/2002 | Okada et al. |

FOREIGN PATENT DOCUMENTS

| JP | 9-041162 | 2/1997 |
| JP | 9-41163 | 2/1997 |

(Continued)

OTHER PUBLICATIONS

International Search Report issued Aug. 6, 2013 in International (PCT) Application No. PCT/JP2013/067365.

*Primary Examiner* — Roberts Culbert
(74) *Attorney, Agent, or Firm* — Wenderoth, Lind & Ponack, LLP

(57) ABSTRACT

Disclosed is a microetching solution, a replenishment solution added to said microetching solution and a method for production of a wiring board using said microetching solution. The microetching solution for copper consists of an aqueous solution containing a cupric ion, an organic acid, a halide ion, a polymer and a nonionic surfactant. The polymer is a water-soluble polymer including a polyamine chain and/or a cationic group and having a weight average molecular weight of 1000 or more. In the microetching solution of the present invention, a value of A/B is 2000 to 9000 and a value of A/D is 500 to 9000, where a concentration of the halide ion is A % by weight, a concentration of the polymer is B % by weight and a concentration of the nonionic surfactant is D % by weight. Using this microetching solution, adhesion to a resin or the like can be uniformly maintained even with a low etching amount.

10 Claims, 5 Drawing Sheets

(56) References Cited

FOREIGN PATENT DOCUMENTS

| JP | 2001-200380 | 7/2001 |
|----|-------------|--------|
| JP | 2001-234367 | 8/2001 |
| JP | 2005-15860 | 1/2005 |
| JP | 2006-111953 | 4/2006 |
| JP | 2008-285720 | 11/2008 |
| JP | 2009-215592 | 9/2009 |
| TW | 201120247 | 6/2011 |

MICROETCHING SOLUTION FOR COPPER, REPLENISHMENT SOLUTION THEREFOR AND METHOD FOR PRODUCTION OF WIRING BOARD

TECHNICAL FIELD

The invention relates to a microetching solution for copper, a replenishment solution therefor and a method for production of a wiring board.

BACKGROUND ART

In the production process of printed wiring boards, commonly a plating resist or an etching resist is formed on the copper layer surface using a photosensitive resin (photoresist), and patterning is performed. For example, in a semi-additive process, a copper layer called a "seed layer" is formed on an insulated board by electroless plating, a plating resist is formed on the seed layer, and then pattern plating is performed by copper electroplating to form patterned metal wiring at a resist opening on the seed layer.

As a pretreatment for forming a resin layer such as a resist on a copper layer such as a seed layer, the copper layer surface is roughened. The roughening treatment is intended not only to activate the copper layer surface but also to improve adhesion to a resist with an anchoring effect by roughening the copper layer surface.

As a method for roughening, conventionally known is a method of roughening the copper layer surface with a microetching solution containing a specific polymer compound as described in Patent Document 1 or a microetching solution containing a specific organic acid as described in Patent Document 2. According to the above mentioned roughening method, adhesion between the copper layer surface and a resist can be improved because deep irregularities are formed on the copper layer surface.

PRIOR ART DOCUMENTS

Patent Documents

Patent Document 1: Japanese Patent Laid-open Publication No. 9-41162
Patent Document 2: Japanese Patent Laid-open Publication No. 9-41163

SUMMARY OF THE INVENTION

Problems to be Solved by the Invention

In recent years, thickness reduction (thickness reduction by employment of electroless plating or the like) of copper layers to be provided with a resist has been promoted. For example, in a semi-additive process, it is necessary that after forming metal wiring by pattern plating on a seed layer provided with a resist, the seed layer on a metal wiring non-forming section be removed by etching. The thickness of a copper layer (seed layer) is preferably as small as possible for making it easy to remove the seed layer and suppressing thinning of wiring during removal of the seed layer.

With the thickness reduction of copper layers, the number of cases has been increased where the roughening treatment of the copper layer surface is difficult, and therefore the activation treatment of the copper layer surface has been increasingly changed to rust removal with dilute sulfuric acid. On the other hand, with the fining the formed line pattern, the activation treatment with dilute sulfuric acid tends to reduce adhesion between the copper layer surface and a patterned resist, raising the problem that productivity is deteriorated. More specifically, a photosensitive resin layer formed on the copper layer surface is developed with a developing solution such as an aqueous sodium carbonate solution after exposure, and the developed pattern is used as a plating resist or an etching resist in the next step, but if adhesion of the resist is not secured in a plating step or an etching step, a desired wiring pattern shape cannot be obtained.

The microetching solutions described in Patent Document 1 and Patent Document 2 improve adhesion by forming deep irregularities on the copper layer surface, and therefore a certain etching amount (e.g. 1.5 µm or more) is required for maintaining adhesion with a resin of a resist or the like. Therefore, when the above-described microetching solution is applied for roughening an electroless plating film (seed layer) having a thickness of, for example, 1 µm or less, as a pretreatment for forming a plating resist in the semi-additive process, the whole electroless plating film may be removed under normal conditions. When the etching amount is decreased for preventing removal of the whole electroless plating film, it becomes difficult to secure uniform adhesion between the electroless plating film and the plating resist because roughening unevenness easily occurs. As a result, a plating resist pattern may have partial defects, so that a desired wiring pattern shape cannot be obtained. Therefore, it is required to develop a microetching solution which can uniformly maintain adhesion to a resin of a resist or the like even with a low etching amount. The "etching amount" refers to an average etching amount (dissolved amount) in the depth direction, and is calculated from a weight and a specific gravity of copper dissolved by a microetching solution, and a front projection area of the copper surface. The same is true for the "etching amount" below.

The present invention has been devised in view of problems associated with conventional techniques as described above, and provides a microetching solution which can uniformly maintain adhesion to a resin or the like even with a low etching amount, a replenishment solution added to the microetching solution, and a method for production of a wiring board using the microetching solution.

Means for Solving the Problem

A microetching solution of copper of the present invention includes an aqueous solution containing a cupric ion, an organic acid, a halide ion, a polymer and a nonionic surfactant. The polymer is a water-soluble polymer including a polyamine chain and/or a cationic group and having a weight average molecular weight of 1000 or more. In the microetching solution of the present invention, it is preferred that where the concentration of the halide ion is A % by weight, the concentration of the polymer is B % by weight and the concentration of the nonionic surfactant is D % by weight, the value of A/B is 2000 to 9000 and the value of A/D is 500 to 9000.

The method for production of a wiring board of the present invention is a method for production of a wiring board which includes a copper layer, the method including a roughening treatment step of bringing the microetching solution into contact with the surface of the copper layer to roughen the surface.

The replenishment solution of the present invention is a replenishment solution which is added to the microetching solution in the method for production of a wiring board of the present invention, the replenishment solution consisting of an aqueous solution containing an organic acid, a halide ion, a polymer and a nonionic surfactant. The polymer is a water-soluble polymer including a polyamine chain and/or a cationic group and having a weight average molecular weight of 1000 or more.

The "copper" in the present invention may consist of copper, or may consist of a copper alloy. The "copper" herein refers to copper or a copper alloy. The "copper layer" in the present invention also includes a copper wiring pattern layer.

Effects of the Invention

According to the present invention, adhesion between copper layer surface and a resin or the like can be uniformly maintained even with a low etching amount.

MODE FOR CARRYING OUT THE INVENTION

<Microetching Solution>

Figure 1:
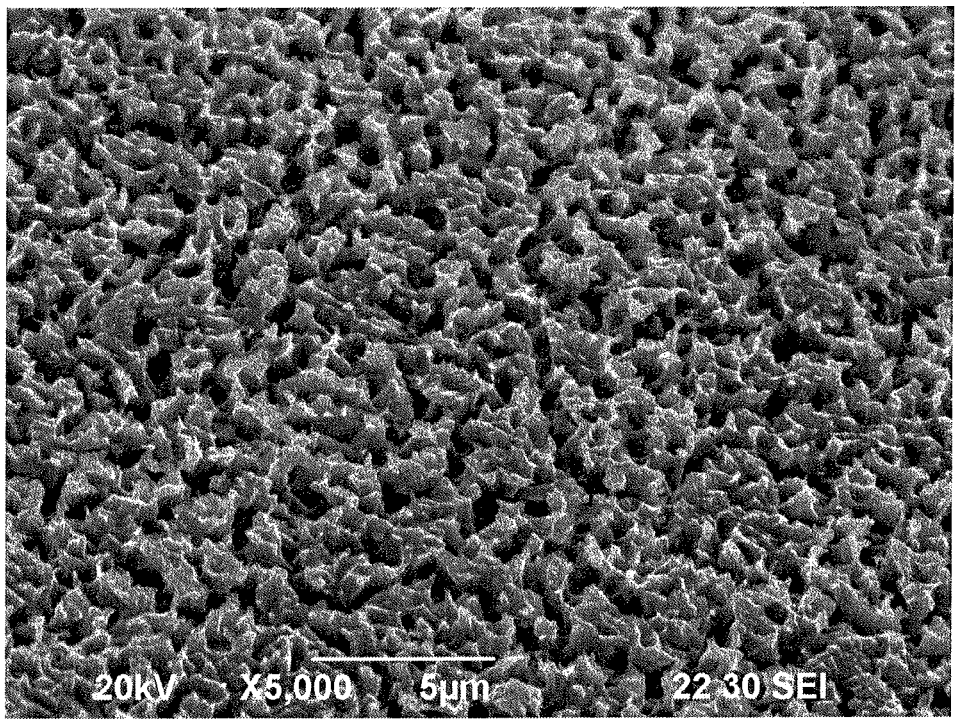
FIG. 1 A scanning electron microscope photograph (photographing angle: 45°, magnification: 5000) of a surface of a copper layer subjected to a roughening treatment with a microetching solution of an example.

A microetching solution for copper of the present invention is an aqueous solution containing a cupric ion, an organic acid, a halide ion, a polymer and a nonionic surfactant. Components contained in the microetching solution for copper of the present invention will be described below.

(Cupric Ion)

The cupric ion acts as an oxidant for oxidizing copper. The cupric ion can be included in a microetching solution by blending a cupric ion source. Examples of the cupric ion source include copper salts of organic acids, cupric chloride, cupric bromide, cupric hydroxide and cupric oxide. The organic acid to form the copper salt is not particularly limited, but the later-described organic acid having a pKa of 5 or less is preferred for properly maintaining an etching rate. The aforementioned cupric ion sources may be used in combination of two or more thereof.

The concentration of the cupric ion is preferably 0.01 to 20% by weight, more preferably 0.1 to 20% by weight, further preferably 0.1 to 10% by weight, for properly maintaining an etching rate.

(Organic Acid)

The organic acid has a function of dissolving copper oxidized by a cupric ion, as well as a function of adjusting pH. It is preferred to use an organic acid having a pKa of 5 or less from the viewpoint of solubility of oxidized copper. Examples of the organic acid having a pKa of 5 or less include: saturated fatty acids such as formic acid, acetic acid, propionic acid, butyric acid, valeric acid and caproic acid; unsaturated fatty acids such as acrylic acid, crotonic acid and isocrotonic acid; aliphatic saturated dicarboxylic acids such as oxalic acid, malonic acid, succinic acid, glutaric acid, adipic acid and pimelic acid; aliphatic unsaturated dicarboxylic acids such as maleic acid; aromatic carboxylic acids such as benzoic acid, phthalic acid and cinnamic acid; carboxylic acids having a substituent, such as oxycarboxylic acids such as glycolic acid, lactic acid, malic acid, and citric acid, sulfamic acid, β-chloropropionic acid, nicotinic acid, ascorbic acid, hydroxypivalic acid and levulinic acid; and derivatives thereof. The aforementioned organic acids may be used in combination of two or more thereof.

The concentration of the organic acid in the microetching solution is preferably 0.1 to 30% by weight, more preferably 0.5 to 25% by weight from the viewpoint of solubility of oxidized copper.

(Halide Ion)

The halide ion has a function of aiding dissolution of copper to form a copper layer surface excellent in adhesion. The halide ion can be included in a microetching solution by blending a halide ion source. Examples of the halide ion source may be ion sources of a chloride ion, a bromide ion and the like. Specific examples thereof include hydrochloric acid, hydrobromic acid, sodium chloride, calcium chloride, potassium chloride, ammonium chloride, potassium bromide, sodium bromide, copper chloride, copper bromide, zinc chloride, iron chloride and tin bromide. Examples of the halide ion source include, in addition the above-mentioned compounds, compounds capable of dissociating a halide ion in a solution. The aforementioned halide ion sources may be used in combination of two or more thereof. Particularly, it is preferred to blend a chloride ion for uniformly forming a copper layer surface excellent in adhesion. For example, cupric chloride can be used as a compound having both effects of a halide ion source and a cupric ion source.

The concentration of the halide ion in the microetching solution is preferably 0.01 to 20% by weight, more preferably 0.1 to 10% by weight, further preferable 0.5 to 5% by weight for forming a copper layer surface excellent in adhesion.

(Polymer)

The polymer for use in the present invention is a water-soluble polymer including a polyamine chain and/or a cationic group and having a weight average molecular weight of 1000 or more. The polymer is blended in the microetching solution together with the above-described halide ion for forming copper layer surface excellent in adhesion. A polymer having a weight average molecular weight of 1000 to 5000000 is preferable from the viewpoint of water solubility. The "weight average molecular weight" is a value obtained in terms of polyethylene glycol by gel permeation chromatography.

Specific examples of the polymer include quaternary ammonium salt-type polymers such as a quaternary ammonium salt-type styrene polymer, a quaternary ammonium salt-type aminoalkyl (meth)acrylate polymer, a quaternary ammonium salt-type diallylamine polymer and a quaternary ammonium salt-type diallylamine-acrylamide copolymer, polyethyleneimine, polyalkylene polyamine, polymers of a salt of aminoalkyl acrylamide, and cationic cellulose derivatives. Examples of the aforementioned salt include hydrochloric acid salts. The aforementioned polymers may be used in combination of two or more thereof. Particularly, one or more selected from quaternary ammonium salt-type polymer, polyethyleneimine and polyalkylene polyamine is/are preferred, quaternary ammonium salt-type polymer is more preferred, so that adhesion between copper layer surface and a resin or the like can be uniformly maintained even with low etching amount, by forming fine irregularities on the copper layer surface. As the polymer, those that are commercially available as antistatic agents for resins and fibers, polymer coagulants for wastewater treatment, conditioning components of hair conditioners and so on may be used.

The concentration of the polymer in the microetching solution is preferably 0.00001 to 1% by weight, more preferably 0.0001 to 0.1% by weight, further preferably 0.0002 to 0.1% by weight for forming the copper layer surface excellent in adhesion.

(Nonionic Surfactant)

A nonionic surfactant is blended in the microetching solution of the present invention for uniformly roughening the copper layer surface. The concentration of the nonionic surfactant in the microetching solution is preferably 0.00001 to 0.1% by weight, more preferably 0.0001 to 0.1% by weight, further preferably 0.0001 to 0.01% by weight for uniformly roughening the copper layer surface and suppressing bubbling during treatment. Nonionic surfactants that can be used in the present invention are those having no polyamine chain.

Examples of the nonionic surfactant may include polyoxyalkylene adducts such as polyhydric alcohol ester polyoxyethylene adducts, higher alcohol polyoxyethylene adducts, alkylphenol polyoxyethylene adducts, polyoxyalkylene alkyl ethers and acetylene glycol polyoxyethylene adducts. The aforementioned nonionic surfactants may be used in combination of two or more thereof. Particularly, acetylene glycol polyoxyethylene adducts are preferred for uniformly roughening the copper layer surface.

The HLB (Hydrophile-Lipophile Balance) of the nonionic surfactant is preferably 6 to 10 for uniformly roughening the copper layer surface. Examples of commercial products of nonionic surfactants having a HLB of 6 to 10 include Surfynol 440 (acetylene glycol polyoxyethylene adduct, manufactured by Nissin Chemical Co., Ltd., HLB=8), Emulgen 404 (polyoxyethylene oleyl ether, manufactured by Kao Corporation, HLB=8.8) and Newcol 2303-Y (polyoxyalkylene alkyl ether, manufactured by Nippon Nyukazai Co, Ltd., HLB=9.1).

In the present invention, it is preferred to blend the components so that where the concentration of the halide ion is A % by weight, the concentration of the polymer is B % by weight, the concentration of the cupric ion is C % by weight and the concentration of the nonionic surfactant is D % by weight, the value of A/B is 2000 to 9000 and the value of A/D is 500 to 9000. In this way, adhesion between the copper layer surface and a resin or the like can be uniformly maintained even with a low etching amount because the copper layer surface can be uniformly roughened at an appropriate rate. Further, since the etching amount can be reduced, replacement frequency of the microetching solution can be reduced, leading to reduction of running costs. The value of A/B is preferably 2100 to 9000, more preferably 2200 to 9000, further preferably 2400 to 9000 for uniformly roughening the copper layer surface. For the same purpose, the value of A/D is preferably 1000 to 9000, more preferably 1000 to 8500.

The value of A/C is preferably 0.30 to 1.40, more preferably 0.30 to 1.00, further preferably 0.35 to 1.00, especially preferably 0.35 to 0.95. When the value of A/C is in the aforementioned range, the copper layer surface tends to have a more uniform roughened shape.

(Other Additives)

The microetching solution of the present invention may contain components other than those described above. For example, a salt such as a sodium salt, a potassium salt or an ammonium salt of an organic acid may be added for reducing variations of pH during roughening treatment, and a complexing agent such as ethylenediamine, pyridine, aniline, ammonia, monoethanolamine, diethanolamine, triethanolamine, N-methyldiethanolamine and the like may be added for improving dissolving stability of copper. In addition, various additives may be added as required. When these additives are added, the concentration of the additives in the microetching solution is about 0.0001 to 20% by weight.

The microetching solution of the present invention can be easily prepared by dissolving the aforementioned components in ion-exchanged water or the like.

<Method for Production of Wiring Board>

A method for production of a wiring board in the present invention is a method for production of a wiring board including a copper layer. The method includes roughening treatment step of bringing the above-described microetching solution of the present invention into contact with the surface of the copper layer to roughen the surface. When a wiring board including a plurality of copper layers is produced, only one of the plurality of copper layers may be treated with the microetching solution of the present invention, or two or more copper layers may be treated with the microetching solution of the present invention.

In the roughening treatment step, the method for bringing the microetching solution into contact with the surface of the copper layer is not particularly limited, and examples thereof include a method in which a microetching solution is sprayed to the surface of a copper layer to be treated and a method in which a copper layer to be treated is dipped in a microetching solution. When the microetching solution is sprayed, it is preferred to perform etching at a microetching solution temperature of 15 to 35° C. and a spray pressure of 0.03 to 0.3 MPa for 30 to 60 seconds. When the copper layer is dipped, it is preferred to perform etching at a microetching solution temperature of 15 to 35° C. for 30 to 90 seconds. Furthermore, when the copper layer is dipped in a microetching solution, it is preferred to blow air into the microetching solution by bubbling or the like so that a cuprous ion generated in the microetching solution by etching of copper is oxidized to a cupric ion. An effluent disposal for the microetching solution of the present invention after use is easy. The disposal treatment can be performed by a general simple method using, for example, a neutralizer, a polymer coagulant or the like.

In the present invention, the etching amount in roughening the surface of the copper layer is preferably 0.03 μm or more, more preferably 0.05 µm or more for improving adhesion to a resin or the like. The etching amount is preferably 1.5 µm or less, more preferably 1.0 µm or less, further preferably 0.5 µM or less for reducing the etching amount to prevent a removal of whole copper layer, when the present invention is applied to a pretreatment for forming a plating resist on a thin copper layer.

In the present invention, it is preferred to wash the roughened copper layer surface with an acidic aqueous solution for removing generated smut after the roughening treatment step. As the acidic aqueous solution to be used for washing, hydrochloric acid, an aqueous sulfuric solution, a nitric acid aqueous solution and the like can be used, but hydrochloric acid is preferred because it has less influence on a roughened shape and has high smut removing performance. From the viewpoint of smut removing performance, the acid concentration of the acidic aqueous solution is preferably 0.3 to 35% by weight, more preferably 1 to 10% by weight. The washing method is not particularly limited, and examples thereof include a method in which an acidic aqueous solution is sprayed to a roughened copper layer surface and a method in which a roughened copper layer is dipped in an acidic aqueous solution. When the acidic aqueous solution is sprayed, it is preferred to perform washing at an acidic aqueous solution temperature of 15 to 35° C. and a spray pressure of 0.03 to 0.3 MPa for 3 to 30 seconds. When the copper layer is dipped, it is preferred to perform washing at an acidic aqueous solution temperature of 15 to 35° C. for 3 to 30 seconds.

The roughening treatment step is preferably a step of roughening the surface of the copper layer while adding a replenishment solution to the microetching solution, wherein the replenishment solution consists of an aqueous solution containing an organic acid, a halide ion, a polymer and a nonionic surfactant. Accordingly, the concentrations of the components in the microetching solution during treatment can be properly maintained. An amount of the replenishment solution and timing of adding the replenishment solution may be appropriately set according to the concentration control range of each component or the like. The components in the replenishment solution are similar to the components contained in the microetching solution of the present invention described above.

The concentrations of the components in the replenishment solution are appropriately adjusted according to the initial concentration of a microetching solution to be used for treatment, or the like, and for example, if the concentration of the organic acid is 0.5 to 30% by weight, the concentration of the halide ion is 0.01 to 20% by weight, the concentration of the polymer is 0.0001 to 1% by weight and the concentration of the nonionic surfactant is 0.0001 to 1% by weight, the concentrations of the components in the microetching solution during treatment can be easily maintained.

The replenishment solution can be easily prepared by dissolving the aforementioned components in ion-exchanged water or the like.

After the treatment with the microetching solution of the present invention, a treatment with an aqueous solution of azoles or an alcohol solution may be performed as disclosed in, for example, U.S. Pat. No. 3,645,772 in order to further improve adhesion to a resin. Further, after the treatment with the microetching solution of the present invention, an oxidation treatment called a brown oxide treatment or a black oxide treatment may be performed.

The microetching solution of the present invention can be widely used for roughening a copper layer surface, and so on. Particularly, irregularities are formed uniformly on the surface of a copper layer treated, leading to satisfactory adhesion to resins of a prepreg, a plating resist, an etching resist, a solder resist, an electrodeposition resist and the like. The microetching solution also provides a surface excellent in solderability, and is therefore particularly useful for production of various wiring boards including those for pin grid array (PGA) and those for ball grid array (BGA). It is also useful for surface treatment of a lead frame. Particularly, for copper layers, the thickness of which is reduced, for example a copper layer of 5 µm or less, particularly copper layers having a thickness of 1 µm or less, such as copper sputtering films, copper vapor-deposition films and copper plating films, it is difficult to perform a uniform roughening treatment by a conventional microetching solution, and therefore the effect of the present invention is effectively exhibited. The thickness of a copper layer included in the wiring board is usually 0.3 µm or more.

Particularly, the microetching solution of the present invention is suitably used for roughening the surface of a seed layer in production of a wiring board by a semi-additive process. That is, according to the present invention, the copper layer (seed layer) surface is uniformly roughened even with a low etching amount, and therefore even when the thickness of the seed layer is as small as, for example, 1 µM or less, adhesion to a resist can be enhanced by roughening the surface without causing such a failure that the whole seed layer is removed. In the semi-additive process, the surface of a copper layer (seed layer) is roughened with the microetching solution of the present invention, followed by forming a resist on the copper layer. Thereafter, metal wiring (generally copper wiring) is formed at a resist opening section on the copper layer by electroplating, and the resist is removed (peeled), followed by removing the copper layer on a metal wiring non-forming section by etching.

EXAMPLES

Examples of the present invention are described along with Comparative Examples. The present invention should not be construed to be limited to Examples below.

<Treatment with Microetching Solution>

As a test board, a substrate having an electroless copper plating film with a thickness of 1.0 µm was provided. The electroless copper plating film of the test board was sprayed at a spray pressure of 0.1 MPa with each of microetching solutions (25° C.) shown in Tables 1-1 to 1-6, and etching was performed with the etching time adjusted so as to have copper etching amount of 0.1 µM. Then, the test board was washed with water, and the etching-treated surface was dipped in hydrochloric acid at a temperature of 25° C. (hydrogen chloride concentration: 3.5% by weight) for 15 seconds, and then washed with water and dried. The remainder of the blending components of each of the microetching solutions shown in Tables 1-1 to 1-6 is ion-exchanged water.

<Evaluation of Uniformity of Roughening by Observation with Scanning Electron Microscope>

Figure 2:
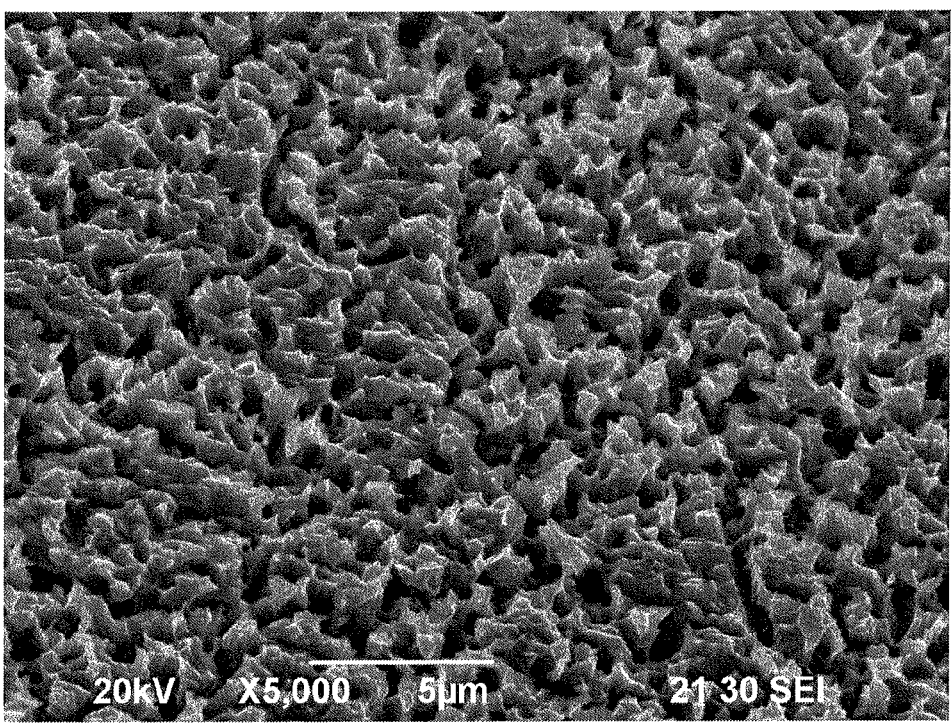
FIG. 2 A scanning electron microscope photograph (photographing angle: 45°, magnification: 5000) of a surface of a copper layer subjected to a roughening treatment with a microetching solution of an example.
Figure 3:
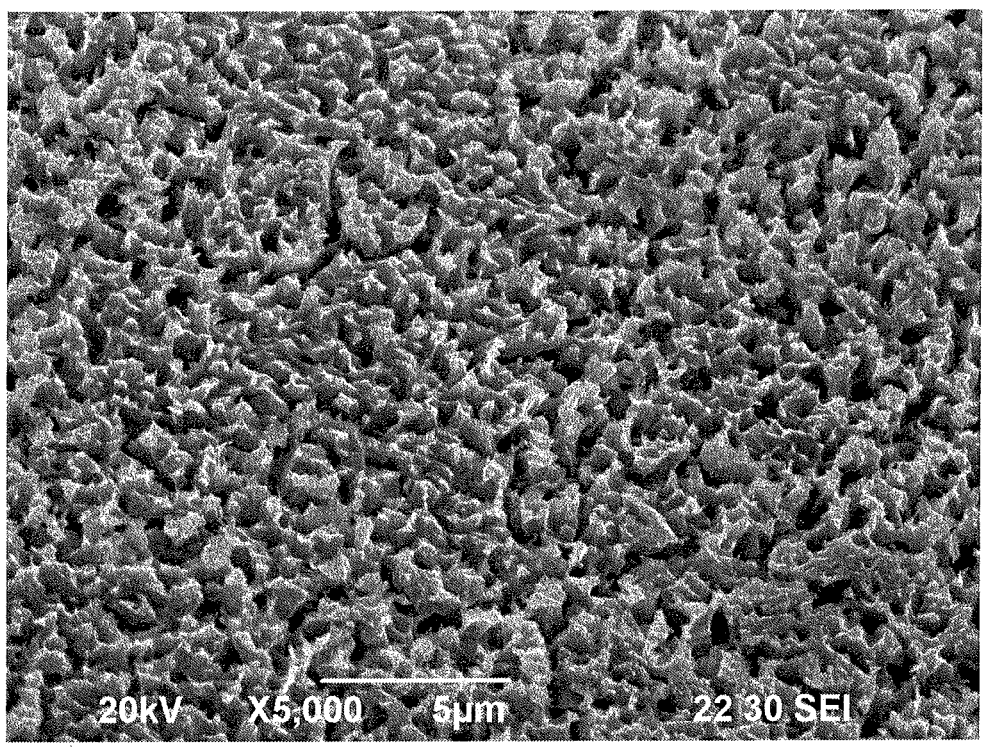
FIG. 3 A scanning electron microscope photograph (photographing angle: 45°, magnification: 5000) of a surface of a copper layer subjected to a roughening treatment with a microetching solution of an example.
Figure 4:
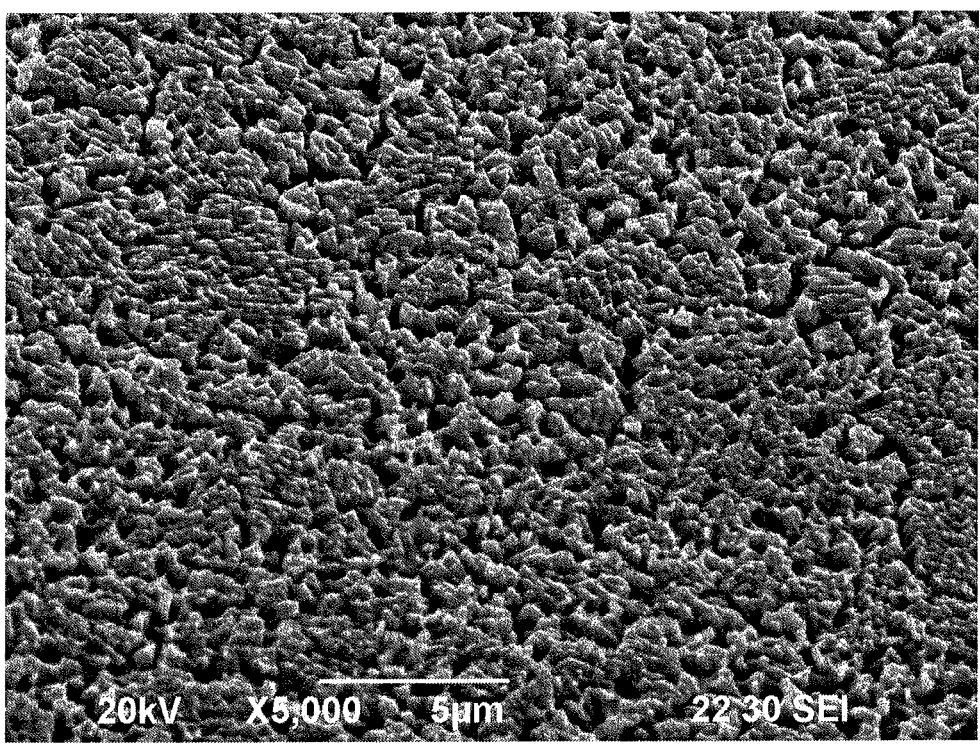
FIG. 4 A scanning electron microscope photograph (photographing angle: 45°, magnification: 5000) of a surface of a copper layer subjected to a roughening treatment with a microetching solution of an example.
Figure 5:
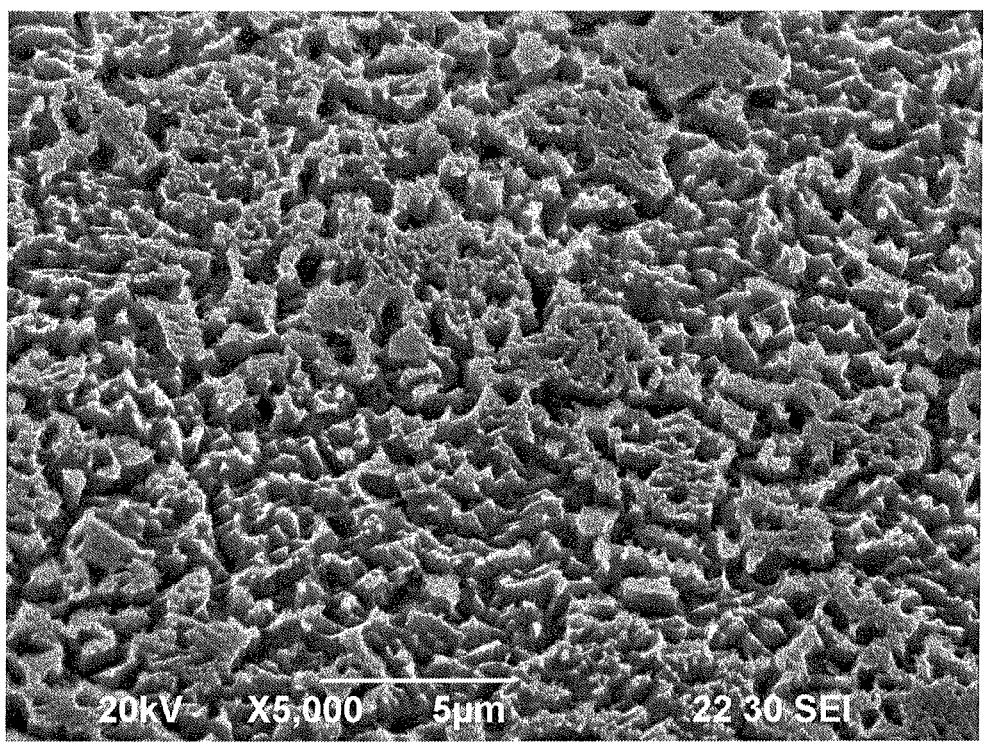
FIG. 5 A scanning electron microscope photograph (photographing angle: 45°, magnification: 5000) of a surface of a copper layer subjected to a roughening treatment with a microetching solution of an example.
Figure 6:
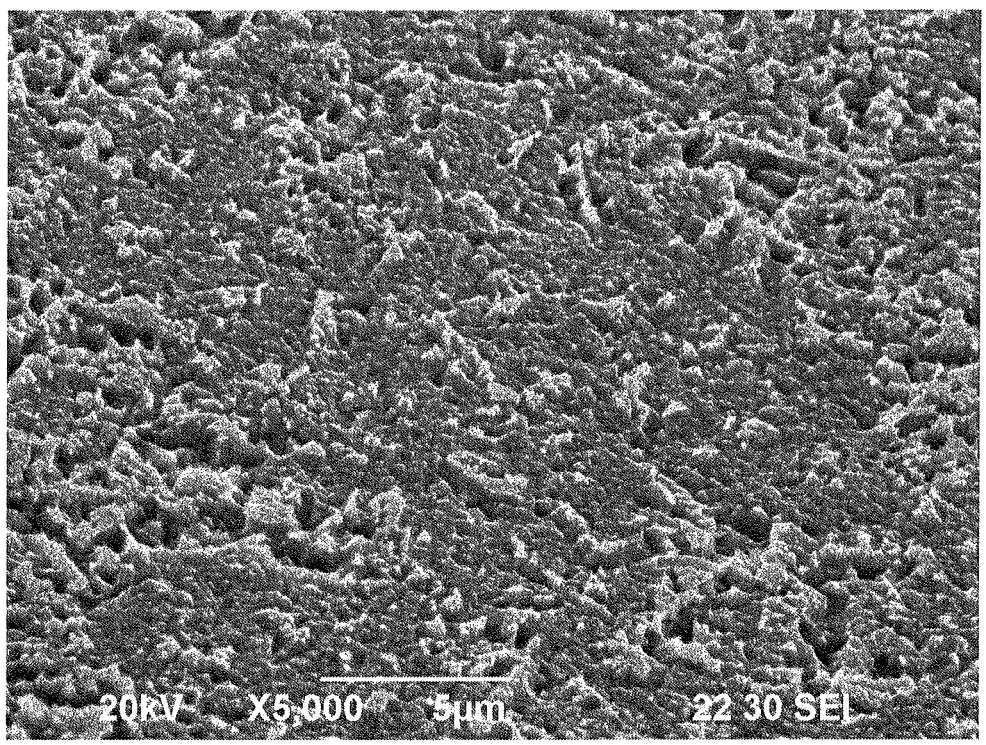
FIG. 6 A scanning electron microscope photograph (photographing angle: 45°, magnification: 5000) of a surface of a copper layer subjected to a roughening treatment with a microetching solution of comparative example.
Figure 8:
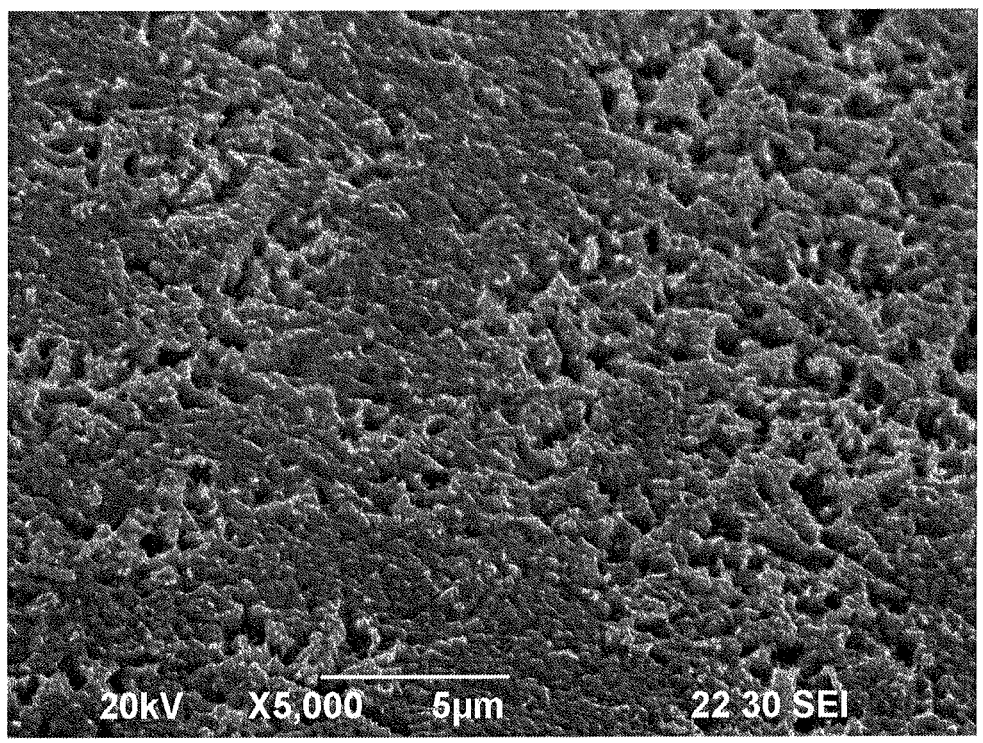
FIG. 8 A scanning electron microscope photograph (photographing angle: 45°, magnification: 5000) of a surface of a copper layer subjected to a roughening treatment with a microetching solution of comparative example.
Figure 9:
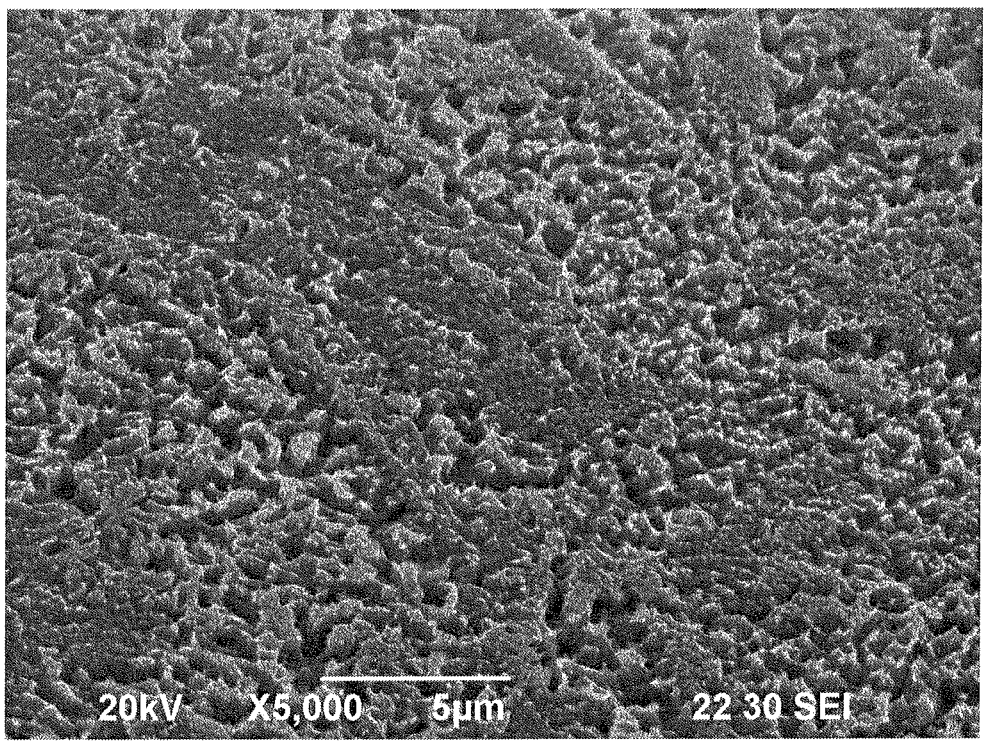
FIG. 9 A scanning electron microscope photograph (photographing angle: 45°, magnification: 5000) of a surface of a copper layer subjected to a roughening treatment with a microetching solution of comparative example.
Figure 10:
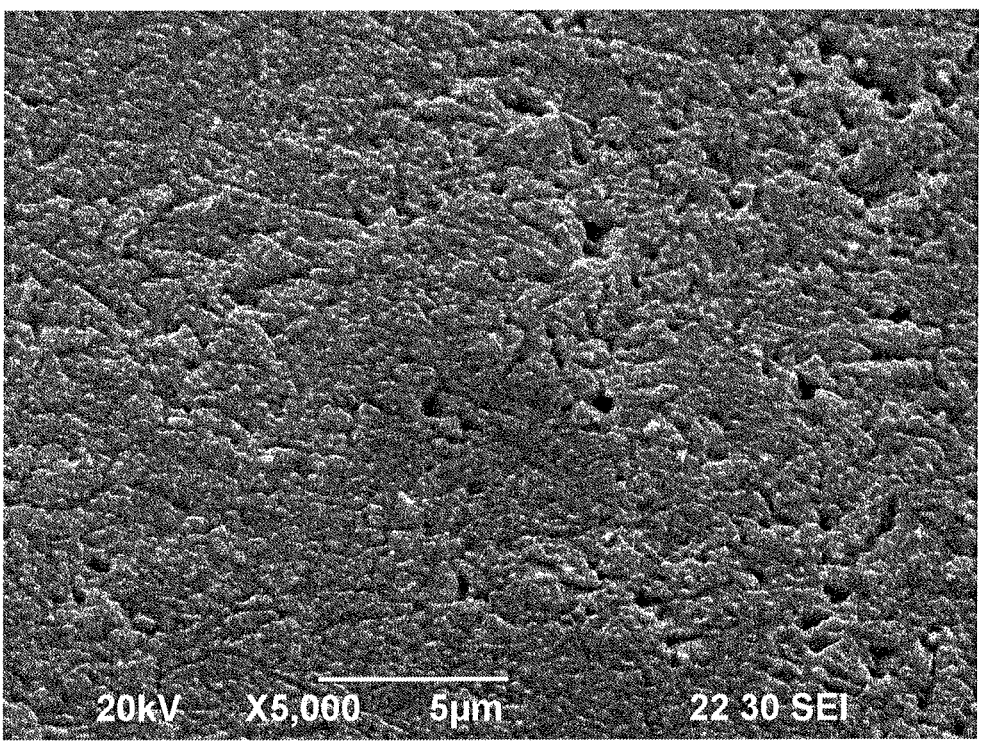
FIG. 10 A scanning electron microscope photograph (photographing angle: 45°, magnification: 5000) of a surface of a copper layer subjected to a roughening treatment with a microetching solution of comparative example.

The surfaces of the electroless copper plating films of the boards treated with the microetching solutions of Examples 1, 2, 6, 9 and 10 and Comparative Examples 2, 3 to 5 and 7 among the test boards were observed with a scanning electron microscope (SEM) (Model: JSM-7000F, manufactured by JEOL Ltd.). FIG. 1 (Example 1), FIG. 2 (Example 2), FIG. 3 (Example 6), FIG. 4 (Example 9), FIG. 5 (Example 10), FIG. 6 (Comparative Example 2), FIG. 7 (Comparative Example 3), FIG. 8 (Comparative Example 4), FIG. 9 (Comparative Example 5) and FIG. 10 (Comparative Example 7) show SEM photographs (photographing angle: 45°, magnification: 5000) taken at the time of SEM observation. From comparison of FIGS. 1 to 5 (Examples) and FIGS. 6 to 10 (Comparative Examples), it is apparent that when the value of A/B is in a range of 2000 to 9000 and the value of A/D is in a range of 500 to 9000, the copper layer surface can be uniformly roughened even with a low etching amount. When roughening unevenness occurs, usually unevenness may also occur in adhesion, resulting in poor adhesion.

<Tape Peeling Test>

A dry film (product number: RY-3325, thickness: 25 μm) manufactured by Hitachi Chemical Company, Ltd. was laminated to the surface of the electroless copper plating film of the test board treated as described above, and the laminate was exposed under an exposure condition of 80 mJ/cm² using a photomask having a line/space of 0.3 mm/0.7 mm as an exposure pattern. Then, a 1 wt % aqueous sodium carbonate solution (25° C.) was sprayed (spray pressure: 0.08 MPa, spray time: 30 seconds) to perform development. Then, a cellophane tape (trade name: Sellotape, Product number: CT405AP-18, manufactured by Nichiban Co., Ltd.) was firmly adhered onto the developed resist pattern by pressing the tape with a finger, followed by peeling off the cellophane tape and checking the presence/absence of peeling of the resist pattern. The results are shown in Tables 1-1 to 1-6.

<Dot Remaining Ratio>

A dry film (SUNFORT SPG-102, thickness: 10 μm) manufactured by Asahi Kasei Corporation was laminated to the surface of the electroless copper plating film of the test board treated as described above, and the laminate was exposed under an exposure condition of 150 mJ/cm² using a photomask having a dot/space of 20 μmφ/40 μm (number of dots: 255) as an exposure pattern. Then, a 1 wt % aqueous sodium carbonate solution (25° C.) was sprayed (spray pressure: 0.05 MPa, spray time: 60 seconds) to perform development. Then, a number of remaining dots after development was counted, and dot remaining ratio was calculated in accordance with the following equation. The results are shown in Tables 1-1 to 1-6. Herein, it can be considered that when the dot remaining ratio is high, adhesion between the copper surface and the resist is uniformly maintained.

Dot remaining ratio(%)=number of remaining dots/255dots×100

TABLE 1-1

| | Blending components | | Halide ion (A) | | Polymer (B) | Nonionic surfactant (D) | Concentration ratio | | Tape Peeling Test | Dot Remaining Ratio (%) |
|---|---|---|---|---|---|---|---|---|---|---|
| | Components | Concentration (% by weight) | Type | Concentration (% by weight) | Concentration (% by weight) | Concentration (% by weight) | A/B | A/D | | |
| Comparative Example 1 | Sodium chloride<br>Sodium formate<br>Formic acid<br>H.C. polymer 2L *¹<br>Cupric oxide<br>Surfynol 440 *² | 1.30<br>6.00<br>5.00<br>0.0040<br>1.30<br>0.0010 | Chloride ion | 0.79 | 0.00080 | 0.0010 | 986 | 789 | Peeling Presented | 32 |
| Comparative Example 2 | Sodium chloride<br>Sodium formate<br>Formic acid<br>H.C. polymer 2L *¹<br>Cupric oxide<br>Strdynol440 *² | 1.60<br>6.00<br>5.00<br>0.0025<br>1.50<br>0.0010 | Chloride ion | 0.97 | 0.00050 | 0.0010 | 1942 | 971 | Peeling Presented | 63 |
| Example 1 | Sodium chloride<br>Sodium formate<br>Formic acid<br>H.C. polymer 2L *¹<br>Cupric oxide<br>Surfynol 440 *² | 2.00<br>6.00<br>5.00<br>0.0025<br>1.80<br>0.0010 | Chloride ion | 1.21 | 0.00050 | 0.0010 | 2427 | 1214 | No peeling | 91 |
| Example 2 | Sodium chloride<br>Sodium formate<br>Formic acid<br>H.C. polymer 2L *¹<br>Cupric oxide<br>Surrynol 440 *² | 3.00<br>6.00<br>5.00<br>0.0025<br>2.80<br>0.0010 | Chloride ion | 1.82 | 0.00050 | 0.0010 | 3641 | 1821 | No peeling | 95 |
| Example 3 | Sodium chloride<br>Sodium formate<br>Formic acid<br>H.C. polymer 2L *¹<br>Cupric oxide<br>Surfynol 440 *² | 1.60<br>6.00<br>5.00<br>0.0020<br>1.30<br>0.0015 | Chloride ion | 0.97 | 0.00040 | 0.0015 | 2427 | 647 | No peeling | 85 |

*¹ manufactured by Osaka Organic Chemical Industry Ltd., 20 wt % aqueous solution of quaternary ammonium salt-type polymer, weight average molecular weight of polymer: 200000
*² manufactured by Nissin Chemical Industry Co., Ltd., nonionic surfactant (acetylene glycol polyoxyethylene adduct, HLB = 8, 100 wt % active constituent)

TABLE 1-2

| | Blending components | | Halide ion (A) | | Polymer (B) | Nonionic surfactant (D) | Concentration ratio | | Tape Peeling Test | Dot Remaining Ratio (%) |
|---|---|---|---|---|---|---|---|---|---|---|
| | Components | Concentration (% by weight) | Type | Concentration (% by weight) | Concentration (% by weight) | Concentration (% by weight) | A/B | A/D | | |
| Example 4 | Sodium chloride<br>Sodium formate<br>Formic acid<br>H.C. polymer 2L*¹<br>Cupric oxide<br>Surfynol 440 *² | 3.30<br>6.00<br>5.00<br>0.0020<br>2.80<br>0.0010 | Chloride ion | 2.00 | 0.00040 | 0.0010 | 5006 | 2003 | No peeling | 92 |

TABLE 1-2-continued

| | Blending components | | Halide ion (A) | | Polymer (B) | Nonionic surfactant (D) | Concentration ratio | | Tape Peeling Test | Dot Remaining Ratio (%) |
|---|---|---|---|---|---|---|---|---|---|---|
| | Components | Concentration (% by weight) | Type | Concentration (% by weight) | Concentration (% by weight) | Concentration (% by weight) | A/B | A/D | | |
| Example 5 | Sodium chloride<br>Sodium formate<br>Formic add<br>H.C. polymer 2L*[1]<br>Cupric oxide<br>Surfynol 440 *[2] | 4.00<br>5.00<br>9.00<br>0.0015<br>4.00<br>0.0010 | Chloride ion | 2.43 | 0.00030 | 0.0010 | 8091 | 2427 | No peeling | 91 |
| Example 6 | Sodium chloride<br>Sodium formate<br>Formic acid<br>H.C. polymer 2L *[1]<br>Cupric oxide<br>Surfynol 440 *[2] | 2.94<br>6.00<br>5.00<br>0.0010<br>2.80<br>0.0010 | Chloride ion | 1.78 | 0.00020 | 0.0010 | 8921 | 1784 | No peeling | 90 |
| Example 7 | Sodium chloride<br>Sodium formate<br>Formic acid<br>H.C. polymer 2L *[1]<br>Cupric oxide<br>Surfynol 440 *[2] | 0.70<br>5.00<br>5.00<br>0.0007<br>2.00<br>0.0005 | Chloride ion | 0.42 | 0.00014 | 0.0005 | 3034 | 850 | No peeling | 88 |
| Example 8 | Sodium chloride<br>Sodium formate<br>Formic acid<br>H.C. polymer 2L *[1]<br>Cupric oxide<br>Surfynol 440 *[2] | 1.30<br>5.00<br>5.00<br>0.0012<br>2.00<br>0.0010 | Chloride ion | 0.79 | 0.00024 | 0.0010 | 3287 | 789 | No peeling | 85 |

*[1] manufactured by Osaka Organic Chemical Industry Ltd., 20 wt % aqueous solution of quaternary ammonium salt-type polymer, weight average molecular weight of polymer: 200000
*[2] manufactured by Nissin Chemical Industry Co., Ltd., nonionic surfactant (acetylene glycol polyoxyethylene adduct, HLB = 8, 100 wt % active constituent)

TABLE 1-3

| | Blending components | | Halide ion (A) | | Polymer (B) | Nonionic surfactant (D) | Concentration ratio | | Tape Peeling Test | Dot Remaining Ratio (%) |
|---|---|---|---|---|---|---|---|---|---|---|
| | Components | Concentration (% by weight) | Type | Concentration (% by weight) | Concentration (% by weight) | Concentration (% by weight) | A/B | A/D | | |
| Comparative Example 3 | Sodium chloride<br>Sodnim formate<br>Formic acid<br>H.C. polymer 2L *[1]<br>Cupric oxide<br>Surfynol 440 *[2] | 3.50<br>6.00<br>5.00<br>0.0010<br>3.00<br>0.0010 | Chloride ion | 2.12 | 0.00020 | 0.0010 | 10620 | 2124 | Peeling Pre-sented | 48 |
| Comparative Example 4 | Sodium chloride<br>Sodium formate<br>Formic acid<br>H.C. polymer 2L *[1]<br>Cupric oxide<br>Surfynol 440 *[2] | 3.10<br>6.00<br>5.00<br>0.0025<br>1.80<br>0.0002 | Chloride ion | 1.88 | 0.00050 | 0.0002 | 3762 | 9406 | No peeling | 65 |
| Example 9 | Sodium chloride<br>Sodium formate<br>Formic acid<br>R C. polymer 2L *[1]<br>Cupric oxide<br>Surfynol 440 *[2] | 2.90<br>6.00<br>5.00<br>0.0025<br>1.80<br>0.0002 | Chloride ion | 1.76 | 0.00050 | 0.0002 | 3520 | 8799 | No peeling | 89 |
| Comparative Example 5 | Sodium chloride<br>Sodium formate<br>Formic acid<br>H.C. polymer 2L *[1]<br>Cupric oxide<br>Surfynol 440 *[2] | 3.00<br>6.00<br>5.00<br>0.0025<br>1.80<br>0.0045 | Chloride ion | 1.82 | 0.00050 | 0.0045 | 3641 | 405 | No peeling | 62 |
| Example 10 | Sodium chloride<br>Sodium formate<br>Formic acid<br>H.C. polymer 2L *[1]<br>Cupric oxide<br>Surfynol 440 *[2] | 3.00<br>6.00<br>5.00<br>0.0025<br>1.80<br>0.0030 | Chloride ion | 1.82 | 0.00050 | 0.0030 | 3641 | 607 | No peeling | 85 |

*[1] manufactured by Osaka Organic Chemical Industry Ltd., 20 wt % aqueous solution of quaternary ammonium salt-type polymer, weight average molecular weight of polymer: 200000
*[2] manufactured by Nissin Chemical Industry Co., Ltd., nonionic surfactant (acetylene glycol polyoxyethylene adduct, HLB = 8, 100 wt % active constituent)

TABLE 1-4

| | Blending components | | Halide ion (A) | | Polymer (B) | Nonionic surfactant (D) | Concentration ratio | | Tape Peeling | Dot Remaining |
|---|---|---|---|---|---|---|---|---|---|---|
| | Components | Concentration (% by weight) | Type | Concentration (% by weight) | Concentration (% by weight) | Concentration (% by weight) | A/B | A/D | Test | Ratio (%) |
| Example 11 | Sodium chloride<br>Sodium formate<br>Formic acid<br>H.C. polymer 2L *1<br>Cupric oxide<br>Surfynol 440 *2 | 3.00<br>6.00<br>5.00<br>0.0025<br>2.10<br>0.0010 | Chloride ion | 1.82 | 0.00050 | 0.0010 | 3641 | 1821 | No peeling | 95 |
| Example 12 | Sodium chloride<br>Formic acid<br>H.C. polymer 2L *1<br>Cupric oxide<br>Surfynol 440 *2 | 3.00<br>5.00<br>0.0025<br>2.80<br>0.0010 | Chloride ion | 1.82 | 0.00050 | 0.0010 | 3641 | 1821 | No peeling | 92 |
| Example 13 | Sodium chloride<br>Sodium acetate<br>Acetic acid<br>H. C. polymer 2L *1<br>Cupric oxide<br>Surfynol 440 *2 | 3.00<br>6.00<br>5.00<br>0.0025<br>2.80<br>0.0010 | Chloride ion | 1.82 | 0.00050 | 0.0010 | 3641 | 1821 | No peeling | 94 |
| Example 14 | Sodium bromide<br>Sodium formate<br>Formic acid<br>H.C. polymer 2L *1<br>Cupric oxide<br>Surfynol 440 *2 | 2.50<br>6.00<br>5.00<br>0.0025<br>2.80<br>0.0010 | Bromide ion | 1.94 | 0.00050 | 0.0010 | 3880 | 1940 | No peeling | 90 |

*1 manufactured by Osaka Organic Chemical Industry Ltd., 20 wt % aqueous solution of quaternary ammonium salt-type polymer, weight average molecular weight of polymer: 200000
*2 manufactured by Nissin Chemical Industry Co., Ltd., nonionic surfactant (acetylene glycol polyoxyethylene adduct, HLB = 8, 100 wt % active constituent)

TABLE 1-5

| | Blending components | | Halide ion (A) | | Polymer (B) | Nonionic surfactant (D) | Concentration ratio | | Tape Peeling | Dot Remaining |
|---|---|---|---|---|---|---|---|---|---|---|
| | Components | Concentration (% by weight) | Type | Concentration (% by weight) | Concentration (% by weight) | Concentration (% by weight) | A/B | A/D | Test | Ratio (%) |
| Comparative Example 6 | Sodium chloride<br>Sodium formate<br>Formic acid<br>H.C. polymer 2L *1<br>Cupric oxide | 3.00<br>6.00<br>5.00<br>0.0025<br>2.80 | Chloride ion | 1.82 | 0.00050 | Not blended | 3641 | — | No peeling | 63 |
| Example 15 | Sodium chloride<br>Sodium formate<br>Formic acid<br>Epomin P-1000*3<br>Cupric oxide<br>Surfynol 440 *2 | 2.90<br>6.00<br>5.00<br>0.0015<br>2.80<br>0.0010 | Chloride ion | 1.76 | 0.00045 | 0.0010 | 3911 | 1760 | No peeling | 90 |
| Example 16 | Sodium chloride<br>Sodium formate<br>Formic acid<br>H.C. polymer 2L*1<br>Cupric oxide<br>Surfyriol 440 *2 | 2.90<br>6.00<br>5.00<br>0.0022<br>2.80<br>0.0010 | Chloride ion | 1.76 | 0.00044 | 0.0010 | 4000 | 1760 | No peeling | 95 |
| Example 17 | Sodium chloride<br>Sodium formate<br>Formic acid<br>H.C. polymer 2L *1<br>Cupric oxide<br>Newcol 2303-Y *4 | 2.90<br>6.00<br>5.00<br>0.0022<br>2.80<br>0.0010 | Chloride ion | 1.76 | 0.00044 | 0.0010 | 4000 | 1760 | No peeling | 90 |
| Example 18 | Sodium chloride<br>Sodium formate<br>Formic acid<br>H.C. polyme 2L *1<br>Cupric oxide<br>Surfynol 440 *2 | 4.00<br>5.00<br>9.00<br>0.0022<br>2.80<br>0.0005 | Chloride ion | 2.43 | 0.00044 | 0.0005 | 5517 | 4855 | No peeling | 94 |

*1 manufactured by Osaka Organic Chemical Industry Ltd., 20 wt % aqueous solution of quaternary ammonium salt-type polymer, weight average molecular weight of polymer: 200000
*2 manufactured by Nissin Chemical Industry Co., Ltd., nonionic surfactant (acetylene glycol polyoxyethylene adduct, HLB = 8, 100 wt % active constituent)
*3 manufactured by Nippon Shokubai Co., Ltd., 30 wt % aqueous solution of polyethyleneimine, weight average molecular weight of polymer: 70000
*4 manufactured by Nippon Nyukazai Co., Ltd., nonionic surfactant (polyoxyalkylene alkyl ether; HLB = 9.1, 100 wt % active constituent)

TABLE 1-6

| | Blending components | | Halide ion (A) | | Polymer (B) | Nonionic surfactant (D) | Concentration ratio | | Tape Peeling | Dot Remaining |
|---|---|---|---|---|---|---|---|---|---|---|
| | Components | Concentration (% by weight) | Type | Concentration (% by weight) | Concentration (% by weight) | Concentration (% by weight) | A/B | A/D | Test | Ratio (%) |
| Comparative Example 7 | Ammonium chloride<br>Acetic acid<br>Epomin. P-1000*[3]<br>Cupric acetate monohydrate | 4.00<br>7.00<br>0.0005<br>5.50 | Chloride ion | 2.65 | 0.00015 | Not blended | 17695 | — | Peeling Pre-sented | 35 |
| Comparative Example 8 | Ammonium chloride<br>Formic acid<br>Epomin P-1000*[3]<br>Cupric formate tetrahydrate | 8.00<br>2.00<br>0.0005<br>7.00 | Chloride ion | 5.31 | 0.00015 | Not blended | 35389 | — | Peeling Pre-sented | 33 |
| Comparative Example 9 | Sodium chloride<br>Acrylic acid<br>Epomin P-1000*[3]<br>Cupric acetate monohydrate<br>Ethylene diamine | 4.00<br>20.00<br>0.0005<br>5.50<br>1.00 | Chloride ion | 2.43 | 0.00015 | Not blended | 16182 | — | Peeling Pre-sented | 38 |
| Comparative Example 10 | Acetic acid<br>Epomin P-1000 *[3]<br>Cupric chloride dihydrate | 5.00<br>0.0005<br>4.00 | Chloride ion | 1.67 | 0.00015 | Not blended | 11105 | — | Peeling Pre-sented | 33 |
| Comparative Example 11 | Glycolic acid<br>Epomin P-1000*[3]<br>Cupric bromide | 10.00<br>0.0005<br>2.00 | Bromide ion | 1.43 | 0.00015 | Not blended | 9542 | — | Peeling Pre-sented | 48 |
| Comparative Example 12 | Acetic acid<br>Epomin SP-200 *[5]<br>Cupric bromide | 6.00<br>0.0001<br>2.00 | Bromide ion | 1.43 | 0.00010 | Not blended | 14605 | — | Peeling Pre-sented | 30 |

*[3] manufactured by Nippon Shokubai Co., Ltd., 30 wt % aqueous solution of polyethyleneimine, weight average molecular weight of polymer: 70000
*[5] manufactured by Nippon Shokubai Co., Ltd., 98 wt % aqueous solution of polyethyleneimine, weight average molecular weight of polymer: 10000

As shown in the results in Tables 1-1 to 1-6, Examples of the present invention were all rated "no peeling" in the tape peeling test even with a low etching amount of 0.1 μm. For the dot remaining ratio, examples of the present invention all showed a high value of 85% or more. On the other hand, comparative examples had poor results as compared to examples for at least one evaluation item. For the dot remaining ratio, comparative examples all showed a low value of 65% or less. These results show that according to the present invention, adhesion between copper and a resist can be uniformly maintained even with a low etching amount because the copper layer surface can be uniformly roughened.

Figure 7:
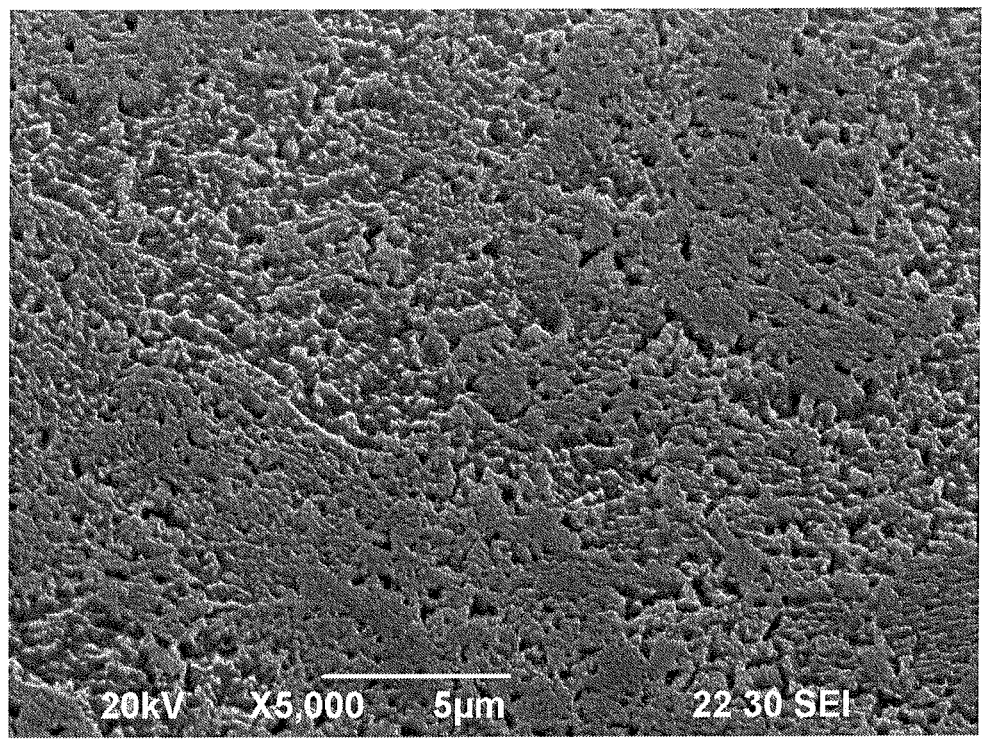
FIG. 7 A scanning electron microscope photograph (photographing angle: 45°, magnification: 5000) of a surface of a copper layer subjected to a roughening treatment with a microetching solution of comparative example.

When Examples and Comparative Examples are examined in more detail, it is apparent that by using a microetching solution with a value of A/B in a predetermined range, a uniform roughened shape can be provided over the entire copper layer surface from comparison of Example 1 (FIG. 1), Example 2 (FIG. 2) and Example 6 (FIG. 3) with Comparative Example 2 (FIG. 6) and Comparative Example 3 (FIG. 7). From comparison of Example 9 (FIG. 4) and Example 10 (FIG. 5) with Comparative Example 4 (FIG. 8) and Comparative Example 5 (FIG. 9), it is apparent that not only the value of A/B but also the value of A/D should be in a predetermined range.

From these results, it is considered that in the present invention, by ensuring that the concentration ratio of three components in a microetching solution, i.e. a halide ion (A), a polymer (B) and a nonionic surfactant (D), is in a predetermined range, a uniform roughened shape is formed on the surface of a copper layer, and consequently adhesion between the copper layer surface and a resin or the like can be uniformly maintained even with a low etching amount.

From comparison of the dot remaining ratios in Examples 15 and 16, it is apparent that roughening uniformity is improved by using a quaternary ammonium salt type polymer as a polymer in a microetching solution. From comparison of the dot remaining ratios in Examples 16 and 17, it is apparent that roughening uniformity is improved by using an acetylene glycol polyoxyethylene adduct as a nonionic surfactant in a microetching solution.

The invention claimed is:

1. A microetching solution for copper, consisting of an aqueous solution containing: a cupric ion; an organic acid; a halide ion; a polymer; and a nonionic surfactant, wherein
   the polymer is a water-soluble polymer including a polyamine chain and/or a cationic group and having a weight average molecular weight of 1000 or more, and
   where a concentration of the halide ion is A % by weight, a concentration of the polymer is B % by weight and a concentration of the nonionic surfactant is D % by weight, a value of A/B is 2000 to 9000 and a value of A/D is 500 to 9000.

2. The microetching solution according to claim 1, wherein where the concentration of the halide ion is 0.01 to 20% by weight.

3. The microetching solution according to claim 1, wherein the polymer is at least one selected from a quaternary ammonium salt-type polymer, polyethyleneimine and polyalkylene polyamine.

4. The microetching solution according to claim 1, wherein the nonionic surfactant is a polyoxyalkylene adduct.

5. A method for production of a wiring board including a copper layer, the method comprising:
   roughening treatment step of bringing a microetching solution into contact with a surface of a copper layer to roughen the surface, wherein
   the microetching solution consists of an aqueous solution containing: a cupric ion; an organic acid; a halide ion; a polymer; and a nonionic surfactant, wherein the polymer is a water-soluble polymer including a polyamine chain and/or a cationic group and having a weight average molecular weight of 1000 or more, and where a concentration of the halide ion is A % by weight, a concentration of the polymer is B % by weight and a concentration of the nonionic surfactant is D % by weight, a value of A/B is 2000 to 9000 and a value of A/D is 500 to 9000.

6. The method for production of a wiring board according to claim 5, wherein the copper layer before being brought into contact with the microetching solution has a thickness of 1 µm or less.

7. The method for production of a wiring board according to claim 5, wherein an average etching amount in a depth direction at a time of roughening the surface of the copper layer is 0.5 µm or less.

8. The method for production of a wiring board according to claim 5, wherein the roughened surface of the copper layer is washed with an acidic aqueous solution after the roughening treatment step.

9. The method for production of a wiring board according to claim 5, wherein
the roughening treatment step is step of roughening the surface of the copper layer while adding a replenishment solution to the microetching solution, the replenishment solution consists of an aqueous solution containing: an organic acid; a halide ion; a polymer; and a nonionic surfactant, and
the polymer contained in the replenishment solution is a water-soluble polymer including a polyamine chain and/or a cationic group and having a weight average molecular weight of 1000 or more.

10. A replenishment solution added to a microetching solution in a method for production of a wiring board, the method comprising: roughening treatment step of bringing a microetching solution into contact with a surface of a copper layer to roughen the surface, while adding a replenishment solution to the microetching solution,
the microetching solution consists of an aqueous solution containing: a cupric ion; an organic acid; a halide ion; a polymer; and a nonionic surfactant, wherein the polymer is a water-soluble polymer including a polyamine chain and/or a cationic group and having a weight average molecular weight of 1000 or more, and where a concentration of the halide ion is A % by weight, a concentration of the polymer is B % by weight and a concentration of the nonionic surfactant is D % by weight, a value of A/B is 2000 to 9000 and a value of A/D is 500 to 9000, wherein
the replenishment solution consists of an aqueous solution containing: an organic acid; a halide ion; a polymer; and a nonionic surfactant, and
the polymer contained in the replenishment solution is a water-soluble polymer including a polyamine chain and/or a cationic group and having a weight average molecular weight of 1000 or more.

* * * * *